United States Patent
Lin et al.

(10) Patent No.: US 11,557,555 B2
(45) Date of Patent: Jan. 17, 2023

(54) BUMPED PAD STRUCTURE

(71) Applicant: Western Digital Technologies, Inc., San Jose, CA (US)

(72) Inventors: Hsiao Jung Lin, Taichung (TW); Ai Wen Wang, Taichung (TW); Chien Te Chen, Taichung (TW); Chieh kai Yang, Changhua (TW)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/897,910

(22) Filed: Jun. 10, 2020

(65) Prior Publication Data
US 2021/0391286 A1 Dec. 16, 2021

(51) Int. Cl.
*H01L 23/00* (2006.01)

(52) U.S. Cl.
CPC .............. *H01L 24/05* (2013.01); *H01L 24/03* (2013.01); *H01L 24/13* (2013.01); *H01L 2224/0362* (2013.01); *H01L 2224/03462* (2013.01); *H01L 2224/0401* (2013.01); *H01L 2224/05017* (2013.01); *H01L 2224/05144* (2013.01); *H01L 2224/05155* (2013.01); *H01L 2224/13026* (2013.01)

(58) Field of Classification Search
CPC ...................................................... H01L 24/05
See application file for complete search history.

(56) References Cited

U.S. PATENT DOCUMENTS

| | | | |
|---|---|---|---|
| 6,696,757 B2 | 2/2004 | Yunus et al. | |
| 6,940,179 B2 | 9/2005 | Lee | |
| 7,566,648 B2 | 7/2009 | Yip et al. | |
| 9,281,259 B2 | 3/2016 | Lin et al. | |
| 2007/0020906 A1* | 1/2007 | Chiu | H01L 24/03 438/597 |
| 2008/0258297 A1* | 10/2008 | Yip | H01L 24/05 257/737 |
| 2010/0013094 A1* | 1/2010 | Jo | H01L 24/14 257/738 |
| 2010/0044884 A1* | 2/2010 | Zbrzezny | H01L 23/49816 257/E21.59 |

* cited by examiner

*Primary Examiner* — William A Harriston
(74) *Attorney, Agent, or Firm* — Volpe Koenig

(57) ABSTRACT

A bumped solder pad and methods for adding bumps to a solder pad are provided. A substrate is provided having metal layer formed thereon and a solder pad formed from a portion of the metal layer. A surface treatment is applied to the solder pad. The surface treatment is patterned. The surface treatment is etched to produce at least one bump on the solder pad.

18 Claims, 9 Drawing Sheets

BUMPED PAD STRUCTURE

FIELD OF INVENTION

The present invention relates to integrated circuits, and more particularly, to a bumped solder pad for an integrated circuit.

BACKGROUND

Solder pads facilitate electrical, mechanical, and thermal connections between electronic components. Typically, solder is deposited onto the solder pads and reflowed to form respective solder joints between the electronic components. FIG. 1 is a side cross-sectional view of a conventional solder pad 100 disposed on a substrate 102. In this example, conventional solder pad 100 is a section of a metal layer 104 formed on substrate 102 that is exposed through an opening in a solder mask 106 made of a solder-resist material. A solder ball 108 is deposited on solder pad 100. The performance and reliability of the electrical, mechanical, and thermal connections (e.g., electrical resistance, mechanical strength, and thermal flux) depends upon the strength of adhesion between solder ball 108 and solder pad 100.

BRIEF DESCRIPTION OF THE DRAWINGS

The following detailed description will be better understood when read in conjunction with the appended drawings. The present invention is illustrated by way of example and is not limited by the accompanying figures, in which like references indicate similar elements. It is to be understood that the drawings are not to scale and have been simplified for ease of understanding.

DETAILED DESCRIPTION OF THE PREFERRED EMBODIMENT(S)

Some implementations provide a method for adding bumps to a solder pad. A substrate is provided having metal layer formed thereon and a solder pad formed from a portion of the metal layer. A resist material is applied to the solder pad. The resist material is patterned. A surface treatment is additively applied to produce at least one bump on the solder pad. In some implementations, the surface treatment includes a metal, such as gold, a nickel-gold alloy, copper, or a copper alloy. In some implementations, the surface treatment is applied to the solder pad by electroplating metal to the solder pad.

In some implementations, the resist material is patterned by applying a photo-resist material to the surface treatment, exposing the photo-resist material through a maskwork, and developing the photo-resist material to remove areas of the photo-resist material. In some implementations, the resist material is patterned by printing a photo-resist material on the surface treatment, or by applying a material to the surface treatment and applying an electron beam to the material to remove areas of the material. In some implementations, additively applying the surface treatment comprises electroplating the surface treatment to the solder pad. In some implementations, patterning the resist material exposes a portion of the solder pad. In some implementations, a second surface treatment is applied to the surface treatment. In some implementations, the second surface treatment includes an organic solderability preservative (OSP).

Some implementations provide a solder pad which includes a metal layer formed on a substrate to form the solder pad. A surface treatment is additively applied to the metal layer, and the surface treatment includes at least one bump. In some implementations, the surface treatment includes a metal, such as gold, a nickel-gold alloy, copper, or a copper alloy.

Some implementations provide a solder pad which includes metal layer means formed on a substrate means to form the solder pad. A surface treatment means is additively applied to the metal layer means, and the surface treatment means includes at least one bump. In some implementations, the surface treatment means includes a metal, such as gold, a nickel-gold alloy, copper, or a copper alloy.

Figure 2:
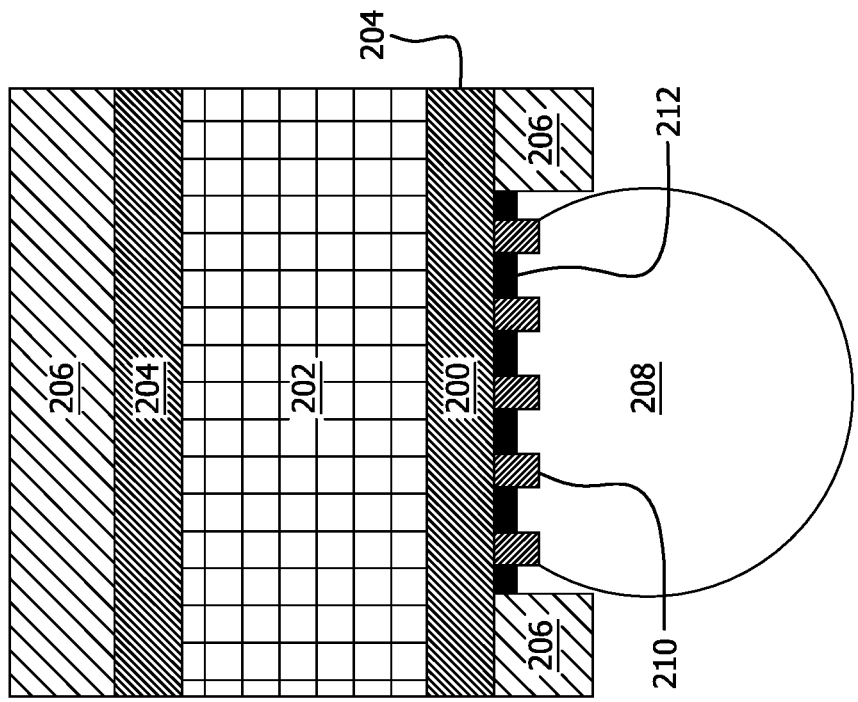
FIG. 2 is a side cross-sectional view of an example solder pad.
Figure 1:
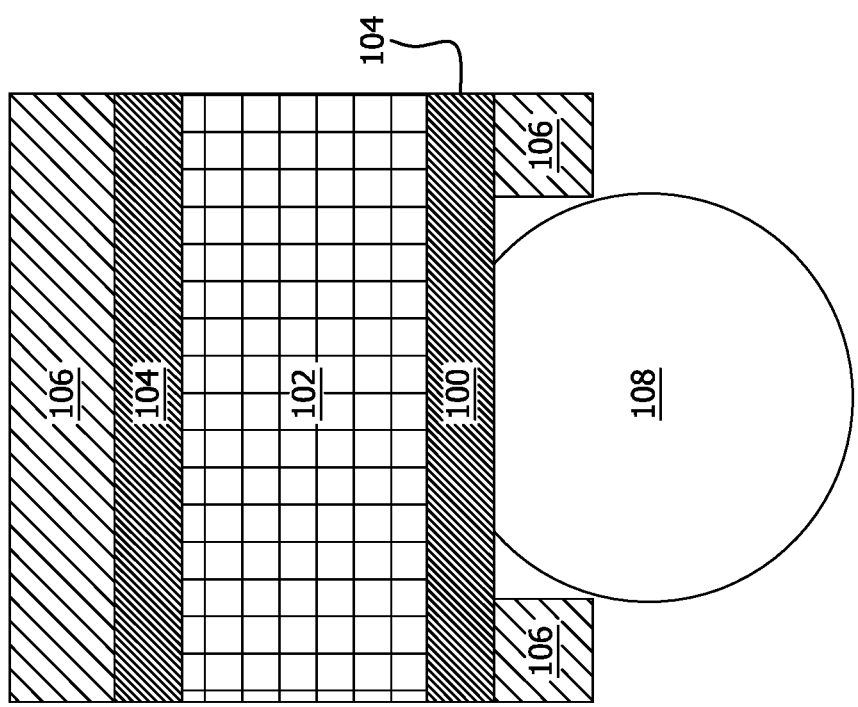
FIG. 1 is a side cross-sectional view of a conventional solder pad.

FIG. 2 is a side cross-sectional view of an example solder pad 200 disposed on a substrate 202. In this example, solder pad 200 is a section of a metal layer 204 formed on substrate 202 that is exposed through an opening in a solder mask 206 made of a solder-resist material, however the structure of solder pad 200 is definable in any suitable manner. Because the performance and reliability of the electrical, mechanical, and thermal connections (e.g., electrical resistance, mechanical strength, and thermal flux) between solder pad 200 and a solder ball 208 deposited on solder pad 200 depends upon the strength of adhesion between solder ball 208 and solder pad 200, a plurality of bumps 210 are attached to solder pad 200. In some implementations, bumps 210 contribute to the strength of adhesion between solder ball 208 and solder pad 200 by providing a contact surface area between solder ball 208 and the combined solder pad 200 and bumps 210 that is greater than the contact surface area of solder pad 200 alone.

Bumps 210 are formed from a suitable conductive material, such as a nickel-gold alloy, and are mechanically, electrically, and thermally connected to solder pad 200. Bumps 210 are referred to as "bumps" simply for convenience, and in some implementations, may take the form of any one or more suitable structures projecting from solder pad 200 such that the effective surface area of the combination of solder pad 200 and bumps 210 is increased beyond the effective surface area of solder pad 200 alone.

In some implementations, bumps 210 are advantageously created during surface finishing or surface protection of solder pad 200. For example, in some implementations, solder pad 200 is made from copper or a copper alloy which is susceptible to tarnishing or other oxidation process through exposure to air, water, heat, acid, or other process environments. In some cases, tarnish or oxidation of the solder pad 200 will reduce solderability, hinder electrical conductivity and/or compromise the adhesion between solder pad 200 and solder ball 208. Accordingly, a surface finish or surface protection layer may be deposited or otherwise adhered to solder pad 200 to prevent tarnishing or oxidation.

A surface finish or surface protection layer may include any suitable material, such as a metal, polymer, organic substance, or other material that is not susceptible (or is less susceptible) to tarnishing or oxidation than the solder pad 200 under expected conditions. For example, if solder pad 200 is made from a copper or copper alloy, suitable surface finishes may include a nickel-gold alloy, or an organic solderability preservative (OSP). In the example of FIG. 2, bumps 210 are made from a nickel-gold alloy deposited on the surface of solder pad 200. Areas of solder pad 200 between bumps 210 are coated with the surface finish 212. In this example, the entirety of solder pad 200 is protected from oxidation, prior to the deposition of solder ball 208, by a combination of bumps 210 and surface finish 212. In this example, surface finish 212 is an optional, additional surface finish that is omitted in some implementations. In some implementations, surface finish 212 comprises a gold/nickel alloy, tin, or OSP. In some implementations, e.g., where the surface finish 212 comprises OSP or a non-metallic material, surface treatment 212 is removed prior to, during, or via the application of solder ball 208. In some implementations, solder ball 208 alloys with bumps 210 and solder pad 200. In some implementations, the surface finish is electroplated, chemically deposited, coated, sputtered, or otherwise applied to the surface of solder pad 200.

After deposition of solder ball 208, bumps 210 contribute to the strength of adhesion between solder ball 208 and solder pad 200, e.g., by providing a contact surface area between solder ball 208 and bumps 210 that is greater than the contact surface area of solder pad 200 alone. In some implementations, heat applied prior to depositing solder ball 208, or in the process of depositing solder ball 208, or to subsequently re-flow solder ball 208, vaporizes or otherwise removes surface finish 212 (e.g., where surface finish 212 is OSP) such that solder ball 208 adheres to and/or alloys with bumps 210 and/or areas of solder pad 200 between bumps 210, providing a contact surface area between solder ball 208 and the combined solder pad 200 and bumps 210 that is greater than the contact surface area of solder pad 200 alone.

It is noted that copper, nickel-gold, and OSP are example materials, and other suitable materials are usable in other implementations. For example, in some implementations, the surface finish includes a copper layer, a pure gold layer, a tin layer, or any other suitable metal or conductor, in place of the nickel-gold alloy. In some implementations, the surface finish includes any other suitable material in place of the OSP. In some implementations, the solder pad includes a copper alloy, tin or tin alloy, or any other suitable conductive metal or material, in place of copper.

Figure 3:
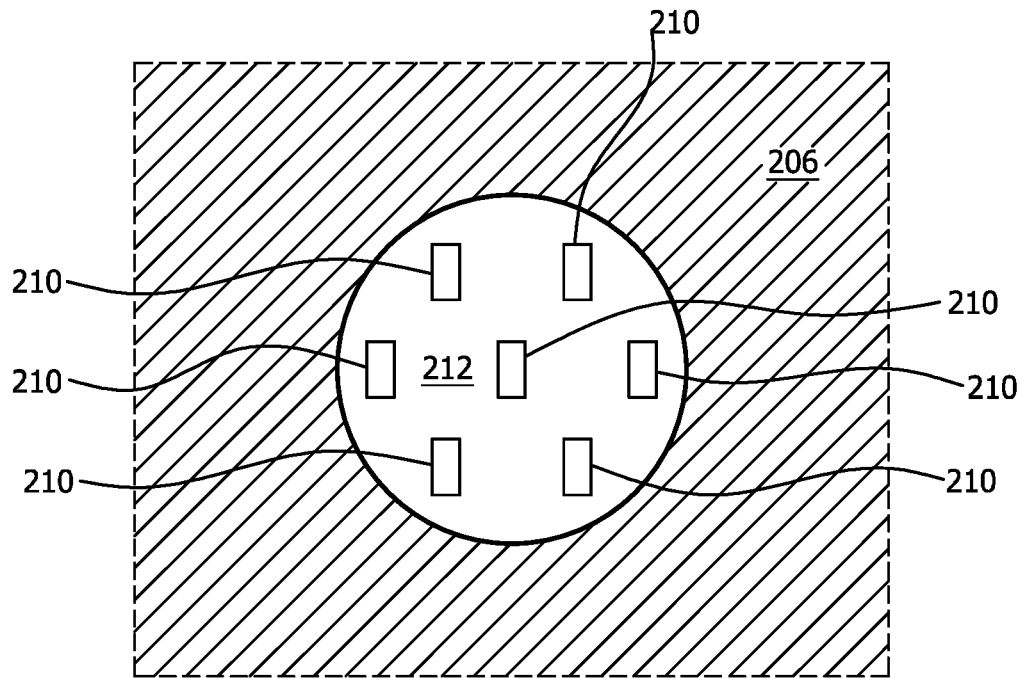
FIG. 3 is a bottom plan view of bumps on the solder pad of FIG. 2.

FIG. 3 is a bottom plan view of the bumps 210, OSP 212, and solder mask 206 as shown and described with respect to FIG. 2. As shown in FIG. 3, OSP 212 covers solder pad 200 (not shown) except for the areas of solder pad 200 attached to bumps 210. Solder mask 206 delimits a circular area covered by OSP 212 in this example, however it is noted that any shape of solder pad area is usable in other implementations. An example number, size, shape, and distribution of bumps 210 is shown in this example, however it is noted that any suitable number, size, shape, and/or distribution of bumps 210 is usable in other implementations.

Structures at example stages of a process for creating bumps on a solder pad as in the example of FIGS. 2 and 3 are shown and described with respect to FIGS. 4-14.

Figure 4:
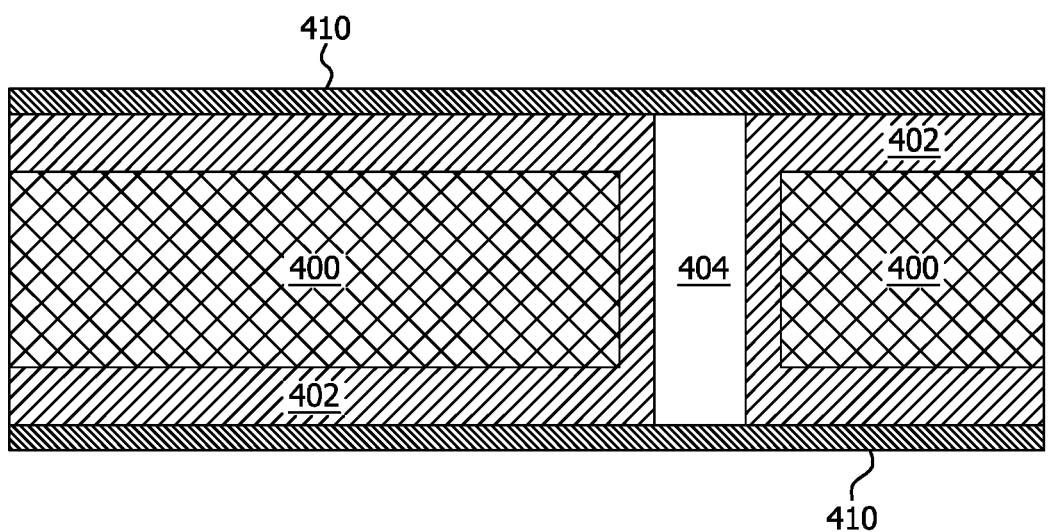
FIG. 4 is a side cross-sectional view of an example substrate and metal layer with photo-resist material.

FIG. 4 is a side cross-sectional view of an example substrate 400. Metal layer 402 is formed on substrate 400, including an area within through-hole 404. A photo-resist material 406 is disposed on the surface of metal layer 402. FIG. 4 illustrates an example photo-resist application step in the creation of an example solder pad. It is noted however that this step is merely exemplary, and as with the other steps described herein, may be altered, reordered, or omitted, in any suitable way, in other implementations.

Substrate 400 is a printed circuit board (PCB) substrate, which is made from a fiber reinforced resin in this example. In other implementations, other substrate applications are possible, such as an integrated circuit (IC) package substrate. In other implementations, other materials are usable, such as phenolic paper, fiberglass cloth, epoxy resin, polyamide, or any other suitable material. Metal layer 402 is a layer of copper attached to a surface of substrate 400. In other implementations, the metal layer may include a copper alloy, or any other suitable conductive metal. Through-hole 404 extends through substrate 400, and is shown for context. It is noted that the various techniques herein are not limited to through-hole mounting technologies, and are applicable to surface mount technologies (SMT) or any other application of a solder pad. Photo-resist material 406 includes any suitable photo-resist material, such as a dry-film photo-resist, and is applied to metal layer 402 in any suitable manner, such as by roll-coating.

After application of photo-resist material 406, specific areas of photo-resist material 406 are masked (e.g., using a patterned transparent plate; i.e., "artwork" or "maskwork") and the un-masked areas are exposed to a suitable type of light in order to activate the photo-resist material.

Figure 5:
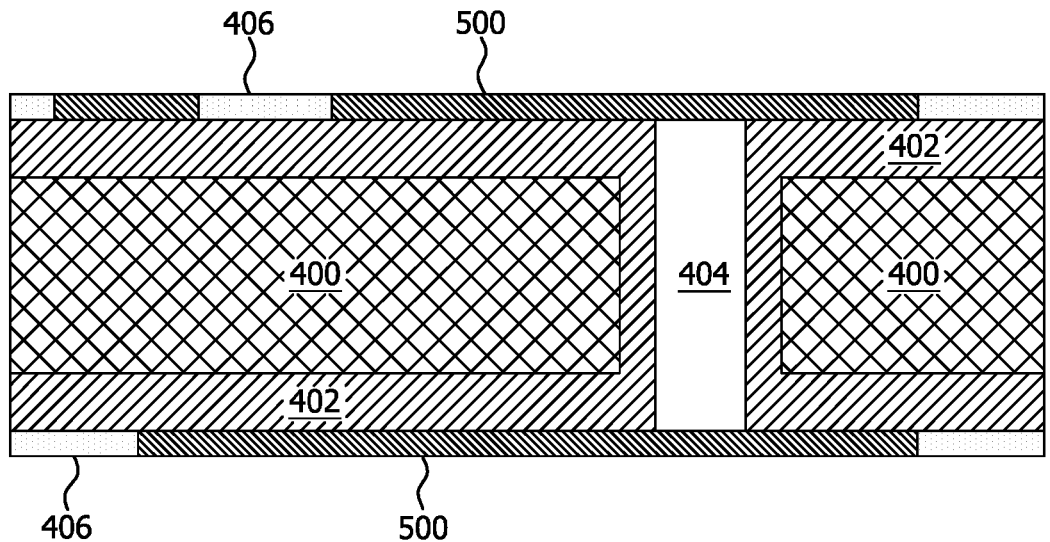
FIG. 5 is a side cross-sectional view of the example substrate and metal layer with photo-resist material of FIG. 4 after exposure of the photo-resist material.

FIG. 5 is a further side cross-sectional view of substrate 400, illustrating photo-resist material 406 after an example pattern exposure. As shown in FIG. 5, exposed resist areas 500 have been irradiated with a suitable type and/or wavelength of light. Depending on the type of photo-resist material, the light may include ultraviolet, laser, or any other light suitable to expose the photo-resist material 406. The pattern of exposed resist areas 500 is defined using a maskwork (not shown) or other suitable technique such that photo-resist material 406 is shielded from the light in areas other than exposed resist areas 500.

In this example, photo-resist material 406 is a negative-working photo-resist material where exposed portions 500 polymerize (and/or otherwise harden or are made resistant to removal by a selective developer agent) after irradiation such that exposed portions 500 are resistant to removal by a developer agent or other photo-resist removal substance. Other implementations may use a positive-working photo-resist material where exposed portions become un-polymerized or otherwise un-harden or become susceptible to removal by a developer or other substance.

After exposed portions 500 have been polymerized (or otherwise hardened or made resistant to removal by a selective developer agent), a developer agent or other photo-resist removal substance is applied to the photo-resist material 406, including exposed portions 500. It is noted that in some implementations, the photo-resist is printed (e.g., by screen printing) on the metal layer and substrate with the desired pattern, or an etch-resistant material is patterned using an electron beam, instead of applying and removing areas of photo-resist using a masking process.

Figure 6:
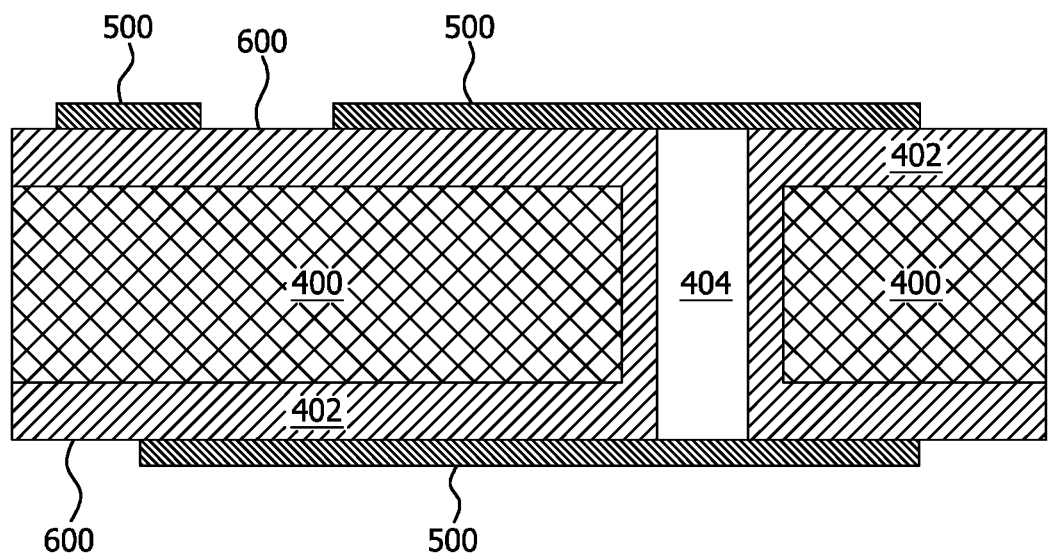
FIG. 6 is a side cross-sectional view of the example substrate and metal layer with photo-resist material of FIGS. 4-5 after removal of unexposed areas of the photo-resist material.

FIG. 6 is a further side cross-sectional view of substrate 400, illustrating exposed portions 500 after application of the developer agent. As shown in FIG. 6, areas of photo-resist material, other than the exposed resist areas 500, have been removed by the developer agent to expose areas 600 of metal layer 402. After areas 600 of metal layer 402 have been exposed by removing the photo-resist material, an etching solution or other metal layer removal substance is applied to areas 600.

Figure 7:
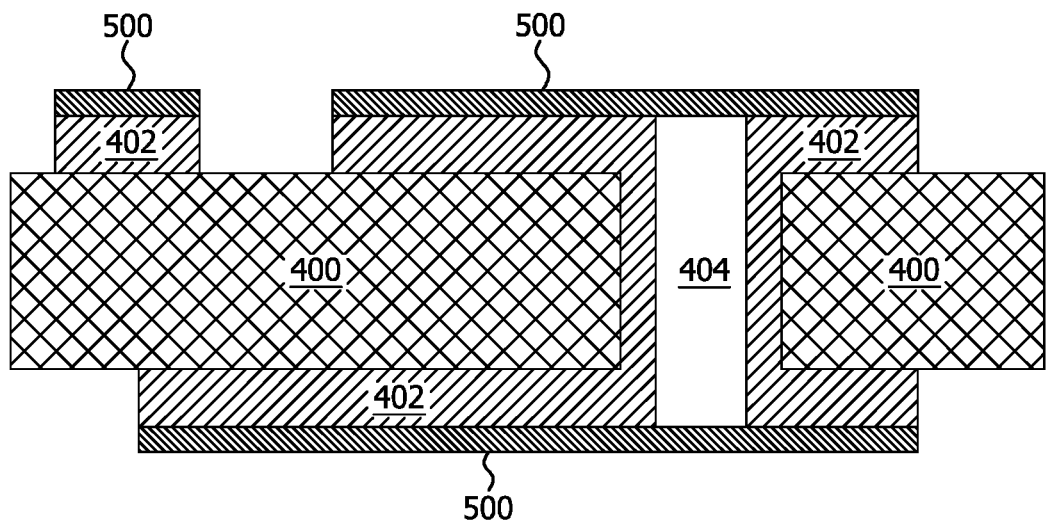
FIG. 7 is a side cross-sectional view of the example substrate and metal layer with photo-resist material of FIGS. 4-6 after removal of exposed areas of the metal layer.

FIG. 7 is a further side cross-sectional view of substrate 400, illustrating metal layer 402 after application of the etching solution. Areas of metal layer 402 other than areas protected by exposed resist areas 500, have been removed by the etching solution. In some implementations, this etching step establishes a pattern of metal traces on substrate 400 for use as electrical connections between components mounted to substrate 400. After metal layer 402 is etched, the exposed resist areas 500 are removed, e.g., using a suitable solvent.

Figure 8:
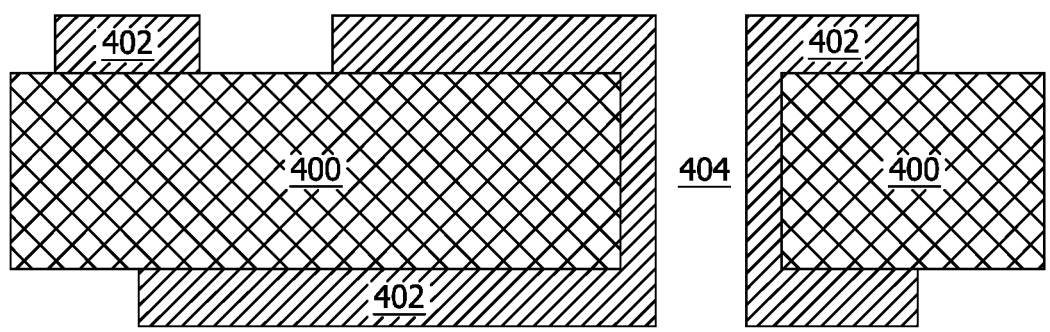
FIG. 8 is a side cross-sectional view of the example substrate and metal layer of FIGS. 4-7 after removal of the remaining photo-resist material.

FIG. 8 is a further side cross-sectional view of substrate 400, illustrating metal layer 402 after removal of the exposed resist areas 500 shown and described with respect to FIG. 7. After removal of the exposed resist areas 500, a solder-resist is applied to exposed surfaces of substrate 400 and metal layer 402.

Figure 9:
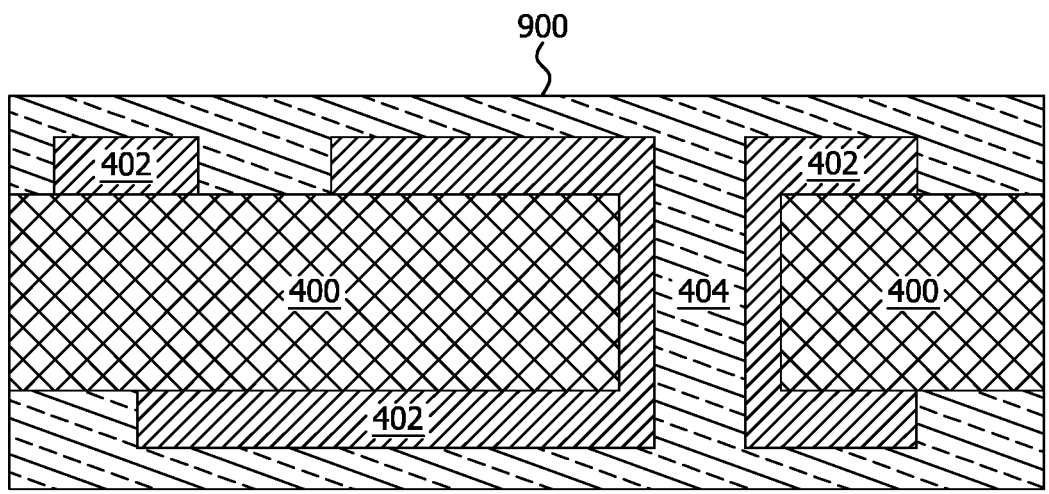
FIG. 9 is a side cross-sectional view of the example substrate and metal layer of FIGS. 4-8 after application of a solder-resist material.

FIG. 9 is a further side cross-sectional view of substrate 400, illustrating metal layer 402 and substrate 400 after application of solder-resist 900. Solder-resist 900 protects areas of metal layer 402 and substrate 400 from solder deposition.

After solder-resist 900 is applied, e.g., by lamination of a solder-resist film or by spray or dip application of a liquid solder-resist material, areas of the solder-resist are removed (e.g., by a photo-resist and developer process similar to the masking and etching of the photo-resist as described with respect to FIGS. 4-6 above). In some implementations, the solder-resist is printed (e.g., by screen printing) on the metal layer and substrate with the desired pattern, or a solder-resist is patterned using an electron beam, instead of applying and removing the solder-resist using a masking process.

Figure 10:
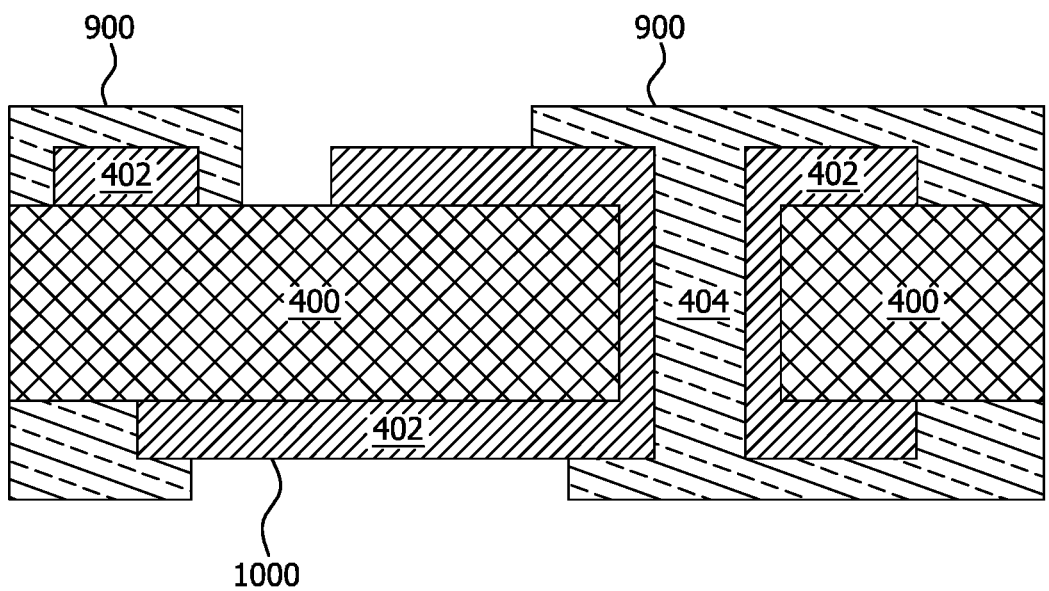
FIG. 10 is a side cross-sectional view of the example substrate, metal layer, and solder-resist material of FIGS. 4-9 after removal of portions of the solder-resist material to define a solder pad.

FIG. 10 is a further side cross-sectional view of substrate 400, illustrating metal layer 402 and substrate 400 after removal of solder-resist 900 from metal layer 402 to define a solder pad 1000. Solder-resist 900 protects areas of metal layer 402 and substrate 400 from solder deposition, and it is removed from an area of metal layer 402 to allow solder to be adhered solder pad 1000. Solder-resist 900 is removed from certain areas in any suitable manner, (e.g., by a photo-resist and developer process similar to the masking and etching of the photo-resist as described with respect to FIGS. 4-6 above). In some implementations, the solder-resist is screen printed or otherwise applied to specific metal layer 402 and substrate 400 in the desired pattern without a separate removal step, or is patterned using an electron beam. After removal of solder-resist 900 from solder pad 1000, a surface treatment is applied to the exposed solder pad 1000 to protect it from oxidation in the latest step as FIG. 15, e.g., prior to deposition of a solder ball.

Figure 11:
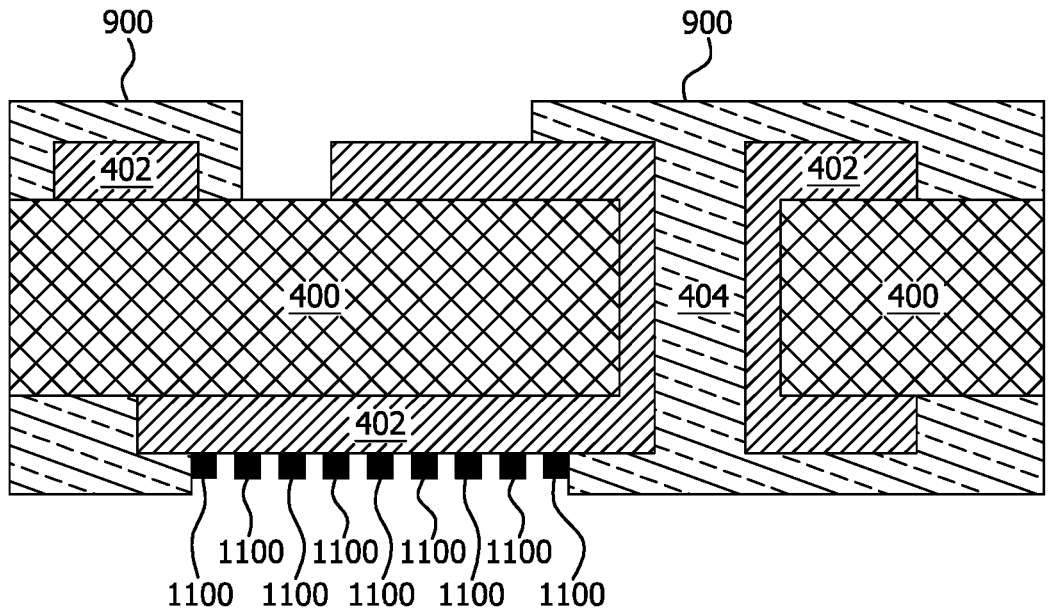
FIG. 11 is a side cross-sectional view of the example substrate, metal layer, solder pad, solder-resist material, and surface treatment of FIGS. 4-11 after adding and developing a photo-resist.

FIG. 11 is a further side cross-sectional view of substrate 400, illustrating metal layer 402 substrate 400, and solder pad 1000, after adding and developing a photo-resist 1100 to allow the addition of bumps to solder pad 1000.

Photo-resist 1100 is patterned using a photo-etching process in this example, (e.g., similar to the masking and etching of photo-resist as described with respect to FIGS. 4-6 above) wherein photo-resist 1100 is applied to solder pad 1000, a suitable light is shone through a patterned maskwork to activate some parts of the photoresist, and the photoresist is selectively dissolved after the photoresist is activated to provide a pattern for deposition (e.g., via electroplating, sputtering, etc.) of bumps on solder pad 1000, after which the remaining photo-resist is removed.

As shown in FIG. 11, photo-resist 1100 is removed from areas of solder pad 1000 to allow for deposition of bumps.

Figure 12:
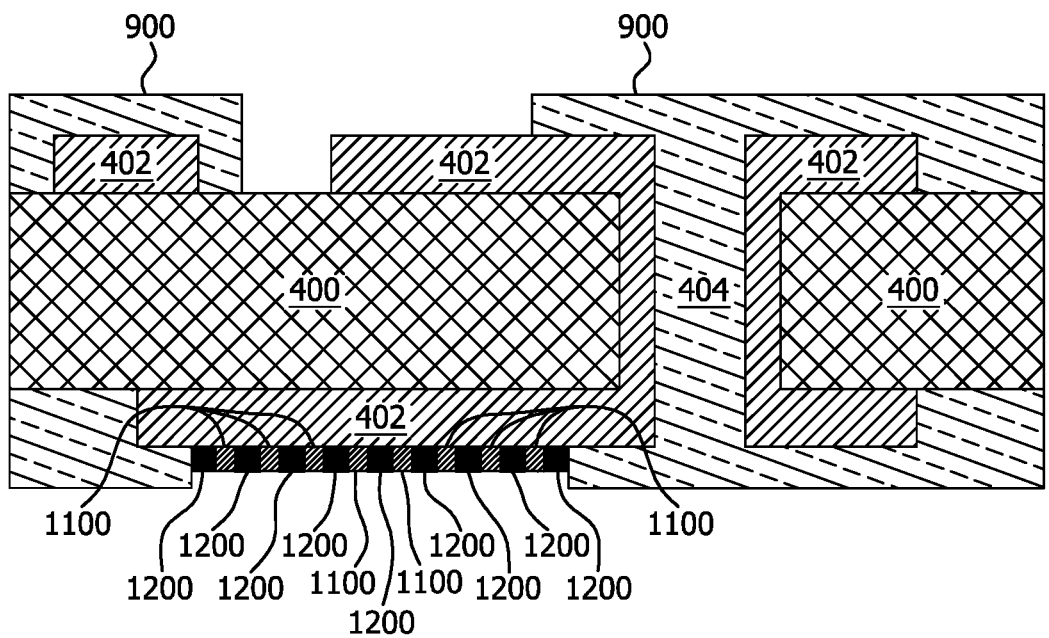
FIG. 12 is a side cross-sectional view of the example substrate, metal layer, solder pad, solder-resist material, and bumps of FIGS. 4-11 after application of a metal material to yield bumps on the solder pad.

FIG. 12 is a further side cross-sectional view of substrate 400, illustrating metal layer 402 substrate 400, solder pad 1000 and photo-resist 1100.

After photo-resist 1100 is partially removed, further surface treatment is applied in the spaces between the remaining photo-resist 1100 to produce surface treatment bumps 1200. Surface treatment bumps 1200 are made from a metal material deposited on or otherwise applied to solder pad 1000. In other implementations, the bumps may be made from a different metal or metal alloy, or a different conductive material.

Figure 13:
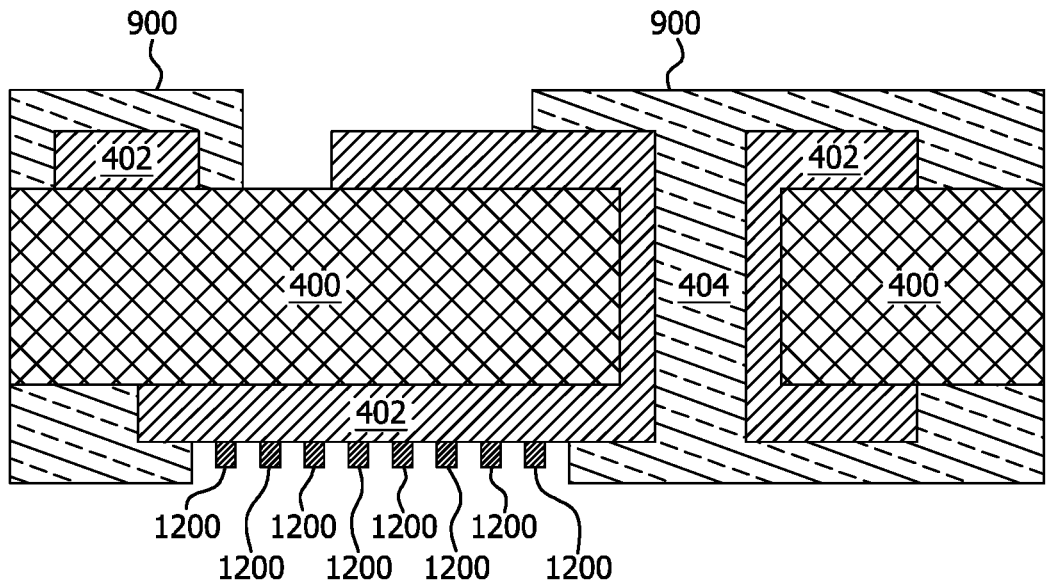
FIG. 13 is a side cross-sectional view of the example substrate, metal layer, solder pad, and bumps of FIGS. 4-12 after removal of the remaining photo-resist material.

FIG. 13 is a further side cross-sectional view of substrate 400, illustrating metal layer 402 substrate 400, solder pad 1000, and bumps 1200, after removal of the remaining photo-resist 1100.

Figure 14:
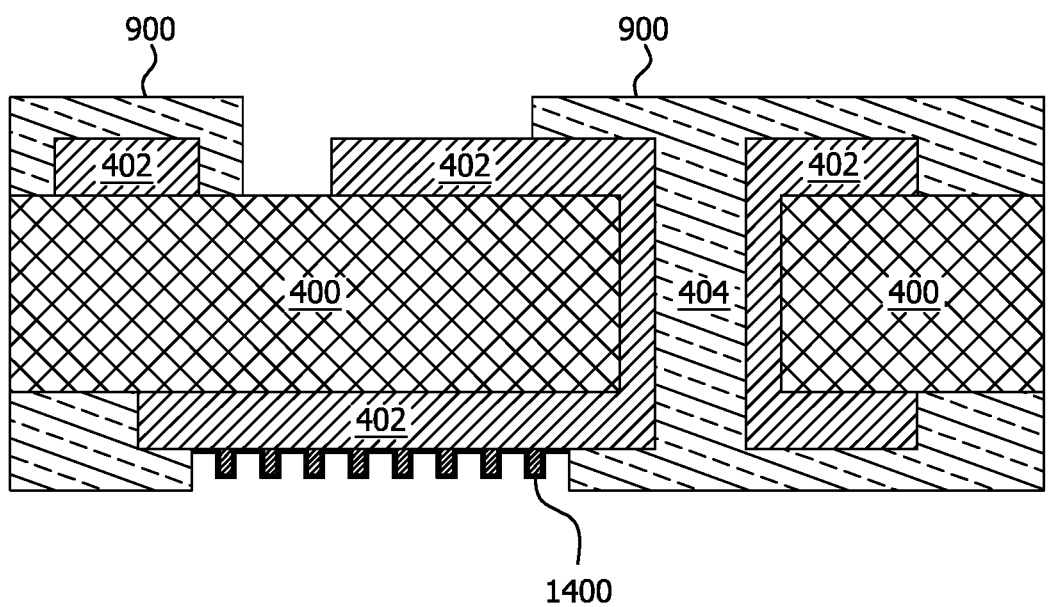
FIG. 14 is a side cross-sectional view of the example substrate, metal layer, solder pad, solder-resist material, and bumps of FIGS. 4-13 after application of a surface treatment to the solder pad and bumps.

FIG. 14 is a further side cross-sectional view of substrate 400, illustrating metal layer 402 substrate 400, solder pad 1000, and bumps 1200. As shown in FIG. 14, surface treatment 1400 is applied to solder pad 1000 and bumps 1200, protecting these areas from oxidation. In some implementations, surface treatment 1400 includes OSP, gold (Au) or tin (Sn). It is noted that as with the other steps described above, this step is omitted in some implementations. After surface treatment 1400 is applied, a solder ball is attached to solder pad 1000 and bumps 1200.

Figure 15:
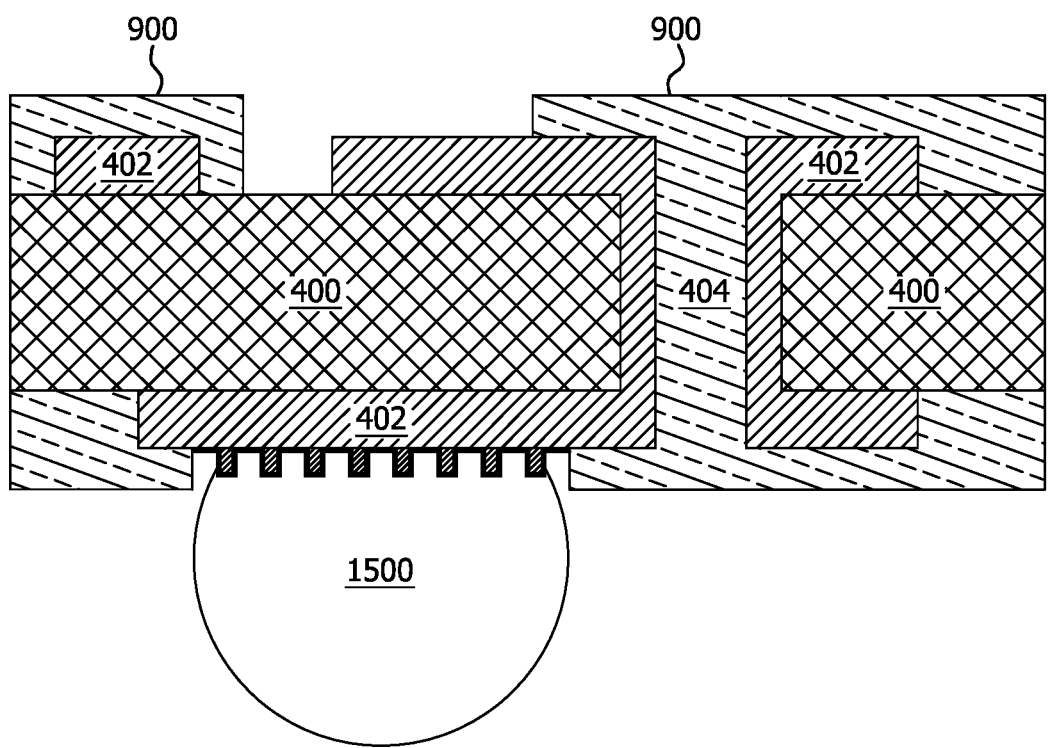
FIG. 15 is a side cross-sectional view of the example substrate, metal layer, solder pad, solder-resist material, bumps, and further surface treatment of FIGS. 4-14 after attachment of a solder ball to the solder pad and bumps.

FIG. 15 is a further side cross-sectional view of substrate 400, illustrating metal layer 402 substrate 400, solder pad 1000, and bumps 1200. As shown in FIG. 15, a solder ball 1500 is attached to solder pad 1000 and bumps 1200. Solder ball 1500 is attached in any suitable manner, such as by touching molten solder to solder pad 1000 and bumps 1200.

In some implementations, heat associated with the attachment of solder ball 1500 to solder pad 1000 and bumps 1200 vaporizes surface treatment 1400 such that it is no longer present. In some implementations, the attached solder ball 1500 protects solder pad 1000 and bumps 1200 from further oxidation.

Figure 16:
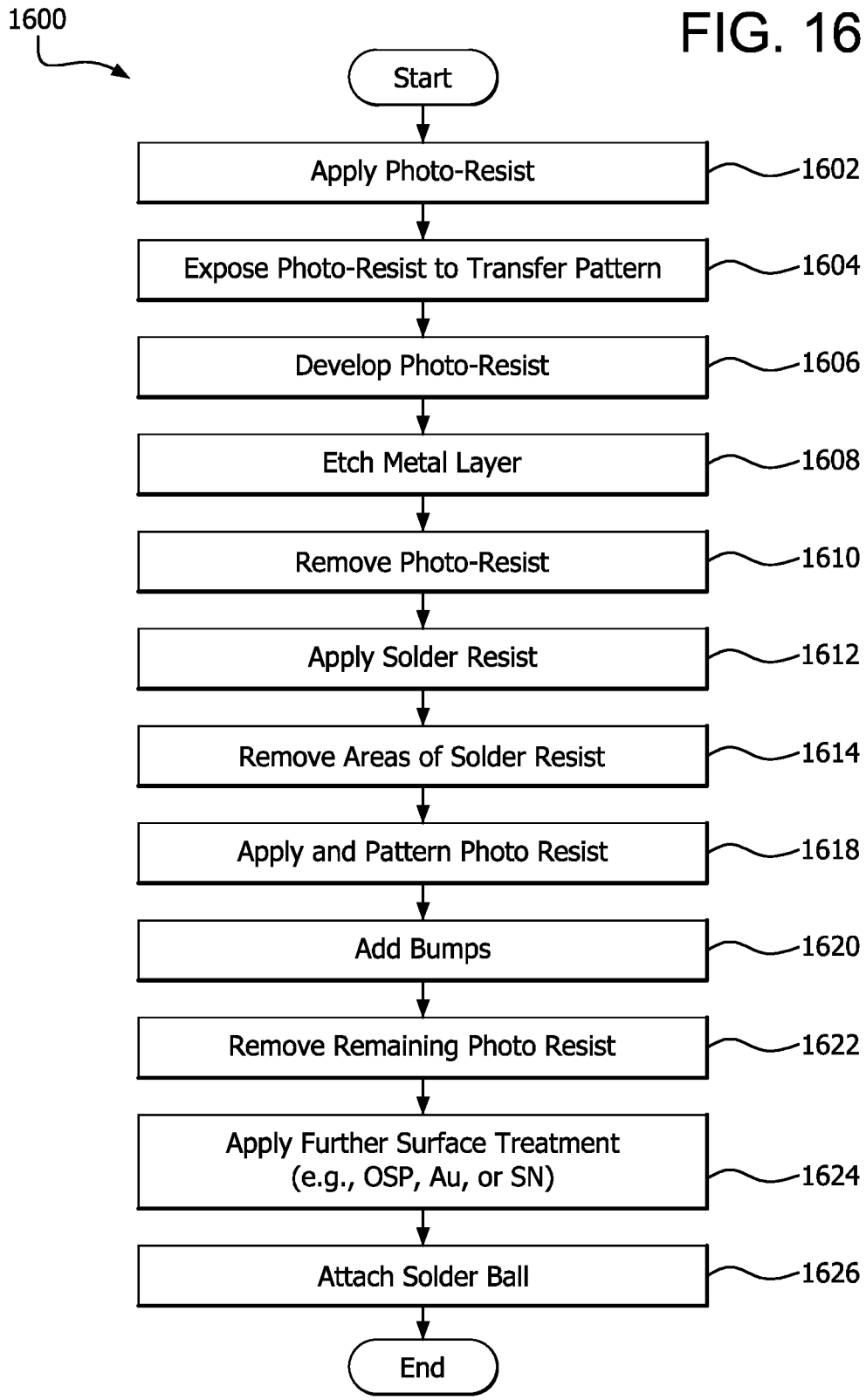
FIG. 16 is a flow chart illustrating an example process which implements bumps on a solder pad as shown and described with respect to FIGS. 2-15.

FIG. 16 is a flow chart illustrating an example process 1600 which implements bumps on a solder pad as shown and described with respect to FIGS. 2-16. The steps of process 1600 are exemplary, and individual steps or portions of steps may be altered, reordered, or omitted, in any suitable way, in other implementations. For example, some implementations apply steps 1616, and 1618 only to an existing workpiece and omit application of OSP and/or attachment of a solder ball.

In step 1602, a photo-resist material is applied (e.g., by lamination of a dry film photo-resist or by spray or dip application of a liquid photo-resist) to surfaces of a metal layer disposed on a substrate as shown and described with respect to FIG. 4.

In step 1604, portions of the applied photo-resist are exposed to an activating light, e.g., as shown and described with respect to FIG. 5, in order to activate the photo-resist material. In some implementations, the light is patterned onto the photo-resist, e.g., using a maskwork, to selectively expose portions of the photo-resist to the activating light. This example uses negative-working photo-resist material, however positive-working photo-resist material is usable in other implementations.

In step 1606, after exposed portions of the photo-resist have been polymerized (or otherwise hardened or made resistant to removal by a selective developer agent), a developer agent or other photo-resist removal substance is applied to remove the unexposed areas of photo-resist material, e.g., as shown and described with respect to FIG. 6. In some implementations, the photo-resist is printed (e.g., by screen printing) on the metal layer with the desired pattern, or an etch-resistant material is patterned using an electron beam, e.g., replacing steps 1602, 1604, and 1606.

In step 1608, after the un-polymerized areas (or areas otherwise resistant to the developer) of photo-resist material have been removed from areas of the metal layer by the developer, the areas of the metal layer exposed by removal of the photo-resist material are removed by an etching solution, e.g., as shown and described with respect to FIG. 7. In step 1610, after the metal layer is etched, the remaining photo-resist material is removed, e.g., as shown and described with respect to FIG. 8.

In step 1612, after the remaining photo-resist material is removed, a solder-resist material is applied to exposed surfaces of the substrate and metal layer, e.g., as shown and described with respect to FIG. 9. In step 1614, after the solder-resist material is applied, areas of the solder resist are removed to expose a portion of the metal layer as a solder pad, e.g., as shown and described with respect to FIG. 10. In some implementations, the areas of the solder-resist material are removed (e.g., similar to the masking and etching of the photo-resist as described with respect to FIGS. 4-6 above). In some implementations, the solder-resist is printed (e.g., by screen printing) on the metal layer and substrate with the desired pattern, or the solder-resist is patterned using an electron beam, e.g., replacing steps 1612 and 1614.

In step 1618, after areas of the solder resist are removed to expose a portion of the metal layer as a solder pad, photo-resist material is applied to the solder pad and developed to produce a pattern to allow the addition of bumps to the solder pad, e.g., as shown and described with respect to FIG. 11. In some implementations, the photo-resist material is applied directly to the solder pad and developed to produce a pattern to allow the addition of bumps directly to the solder pad.

In step 1620, after the photo-resist material is applied to the ssolder pad and developed to produce a pattern to allow the addition of bumps to the solder pad, a metal material is deposited or otherwise applied to the solder pad in the spaces between the remaining photo-resist to produce surface treatment bumps or other surface features, e.g., as shown and described with respect to FIG. 12. In some implementations, the surface treatment bumps are made from the same nickel-gold alloy as the surface treatment and/or solder pad. In other implementations, the bumps may be made from a different metal or metal alloy, such as gold, tin, alloys including these metals, or a different conductive material.

In step 1622, after the bumps are applied, the remaining photo-resist is removed, e.g., as shown and described with respect to FIG. 13. In step 1624, a further surface treatment (e.g., OSP, Au, Sn) is applied over the surface treatment and bumps, e.g., as shown and described with respect to FIG. 14. In some implementations, step 1624 is omitted.

In step 1626, a solder ball is attached to the further surface treatment and bumps (and OSP or other additional surface treatment if applied at step 1624), e.g., as shown and described with respect to FIG. 15.

As is evident from the foregoing discussion, various implementations provide a bumped solder pad and a method of making a bumped solder pad with advantageous adhesive properties. For example, in some implementations, the increased contact area provided by the addition of bumps to the solder pad facilitates adhesion of solder to the solder pad, e.g., to avert brittle fracture and solder ball drop. Furthermore, in some implementations, the increased contact area enhances thermal and electrical conductivity between electronic components. Still further, in some implementations, the addition and etching of a surface finish in some implementations to form the bumps advantageously provides increased surface area without compromising the solder pad and/or associated metal layer through etching.

The examples above are illustrative and not intended to be exhaustive or to limit the invention to the forms disclosed. It will be appreciated by those skilled in the art that changes could be made to the embodiments described above without departing from the inventive concept. For example, the present invention may be applied to ball grid array (BGA) packages or any solderable surfaces. It is to be understood that the invention is not limited to the particular example implementations discussed herein.

What is claimed is:

1. A method for adding at least one bump to a solder pad, the method comprising:
   providing a substrate having a metal layer formed thereon and the solder pad formed from a portion of the metal layer;
   applying and developing a photo-resist material to the solder pad;
   applying a solder resist;
   removing areas of the solder resist;
   patterning the photo-resist material including selectively dissolving portions of the photo-resist material;
   additively applying a surface treatment to the solder pad to produce the at least one bump on the solder pad;
   removing remaining portions of the photo-resist material; and applying a second surface treatment to the surface treatment, the second surface treatment comprising an organic solderability preservative.

2. The method according to claim 1, wherein the surface treatment comprises a metal.

3. The method according to claim 1, wherein the surface treatment comprises gold.

4. The method according to claim 1, wherein the surface treatment comprises a nickel-gold alloy.

5. The method according to claim 1, wherein applying the surface treatment to the solder pad comprises electroplating metal to the solder pad.

6. The method according to claim 1, wherein additively applying the surface treatment comprises electroplating the surface treatment to the solder pad.

7. The method according to claim 1, wherein patterning the photo-resist material exposes a portion of the solder pad.

8. The method according to claim 1, the method further comprising:
exposing the photo-resist material to a transfer pattern; and
etching the metal layer.

9. A solder pad comprising:
a metal layer formed on a substrate to form the solder pad;
a photo-resist layer applied, developed, and patterned to the solder pad to selectively dissolve portions of the photo-resist material prior to one or more surface treatments;
a surface treatment additively applied to the metal layer, the surface treatment comprising at least one bump; and
a second surface treatment applied to the surface treatment, the second surface treatment comprising an organic solderability preservative.

10. The solder pad according to claim 9, wherein the surface treatment comprises a metal.

11. The solder pad according to claim 9, wherein the surface treatment comprises gold.

12. The solder pad according to claim 9, wherein the surface treatment comprises a nickel-gold alloy.

13. The solder pad according to claim 9, wherein additively applying the surface treatment to the solder pad comprises electroplating metal to the solder pad.

14. A solder pad comprising:
a metal layer means formed on a substrate means to form the solder pad;
a photo-resist means applied, developed, and pattered to the solder pad to selectively dissolve portions of the photo-resist material prior to one or more surface treatment means;
a surface treatment means additively applied to the metal layer means, the surface treatment means comprising at least one bump; and
a second surface treatment means applied to the surface treatment, the second surface treatment comprising an organic solderability preservative.

15. The solder pad according to claim 14, wherein the surface treatment means comprises a metal.

16. The solder pad according to claim 14, wherein the surface treatment means comprises gold.

17. The solder pad according to claim 14, wherein the surface treatment means comprises a nickel-gold alloy.

18. The solder pad according to claim 14, wherein additively applying the surface treatment means to the solder pad comprises electroplating metal to the solder pad.

* * * * *